(12) United States Patent
Duqi et al.

(10) Patent No.: US 10,427,933 B2
(45) Date of Patent: Oct. 1, 2019

(54) MICROELECTROMECHANICAL SENSOR DEVICE WITH REDUCED STRESS-SENSITIVITY AND CORRESPONDING MANUFACTURING PROCESS

(71) Applicant: STMICROELECTRONICS S.R.L., Agrate Brianza (IT)

(72) Inventors: Enri Duqi, Milan (IT); Sebastiano Conti, Pregnana Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/880,332

(22) Filed: Jan. 25, 2018

(65) Prior Publication Data

US 2018/0148321 A1  May 31, 2018

Related U.S. Application Data

(62) Division of application No. 15/074,755, filed on Mar. 18, 2016, now Pat. No. 9,914,639.

(30) Foreign Application Priority Data

Sep. 11, 2015  (IT) .............................. MI2015A0852

(51) Int. Cl.
*B81B 7/00* (2006.01)
*B81B 3/00* (2006.01)
*B81C 1/00* (2006.01)

(52) U.S. Cl.
CPC .......... *B81B 7/0054* (2013.01); *B81B 3/0051* (2013.01); *B81B 7/0048* (2013.01); *B81B 7/008* (2013.01); *B81B 2201/0264* (2013.01); *B81C 1/00325* (2013.01); *H01L 2224/48091* (2013.01)

(58) Field of Classification Search
CPC ... B81B 7/0054; B81B 3/005; B81C 1/00301; B81C 1/00333; B81C 1/00341; B81C 1/00476; B81C 1/00968; B81C 1/00912
See application file for complete search history.

(56) References Cited

U.S. PATENT DOCUMENTS

| | | | |
|---|---|---|---|
| 2004/0232507 | A1 | 11/2004 | Furukubo et al. |
| 2007/0089511 | A1 | 4/2007 | Sasaki |
| 2011/0147860 | A1 | 6/2011 | Robert et al. |
| 2011/0298064 | A1 | 12/2011 | Pahl et al. |

(Continued)

FOREIGN PATENT DOCUMENTS

DE  102007010711 A1  9/2008

*Primary Examiner* — Wael M Fahmy
*Assistant Examiner* — Sarah K Salerno
(74) *Attorney, Agent, or Firm* — Seed Intellectual Property Law Group LLP

(57) ABSTRACT

A MEMS device is provided with: a supporting base, having a bottom surface in contact with an external environment; a sensor die, which is of semiconductor material and integrates a micromechanical detection structure; a sensor frame, which is arranged around the sensor die and is mechanically coupled to a top surface of the supporting base; and a cap, which is arranged above the sensor die and is mechanically coupled to a top surface of the sensor frame, a top surface of the cap being in contact with an external environment. The sensor die is mechanically decoupled from the sensor frame.

22 Claims, 6 Drawing Sheets

(56) References Cited

U.S. PATENT DOCUMENTS

| | | | |
|---|---|---|---|
| 2013/0020718 A1* | 1/2013 | Chou | H01L 24/80 257/774 |
| 2015/0041927 A1 | 2/2015 | Geisberger et al. | |
| 2016/0061677 A1* | 3/2016 | Han | B81B 7/0048 257/415 |

* cited by examiner

Known Art

Known Art

Known Art

MICROELECTROMECHANICAL SENSOR DEVICE WITH REDUCED STRESS-SENSITIVITY AND CORRESPONDING MANUFACTURING PROCESS

BACKGROUND

Technical Field

The present disclosure relates to a MEMS (MicroElectroMechanical System) sensor device with reduced stress-sensitivity, and to a corresponding manufacturing process.

Description of the Related Art

In integrated semiconductor devices, and particularly in MEMS devices, mechanical stresses and strains occur, which may lead to undesired modifications and drifts of the electrical parameters, for example of the detection sensitivity.

MEMS devices typically include one or more dies of semiconductor material, in which the corresponding micromechanical detection structure and possibly a corresponding ASIC (Application-Specific Integrated Circuit) are provided, the latter for example including a corresponding interface for acquisition and pre-processing of the detected electrical quantities (for example, a capacitive variation indicating a detected pressure) for generation of an electrical output signal (which is supplied at the output from the MEMS device, for subsequent processing operations).

MEMS devices further include a package, which encloses and protects the dies of the detection structure and of the possible ASIC, further providing an interface for electrical connection with the outside world. In so-called "substrate-level package" solutions, the package is made by one or more base and cap layers, which are directly coupled to the dies of the MEMS device, constituting the interface thereof with the outside world.

It is known that mechanical stresses are induced in the dies housed within the package of the MEMS devices, typically due to deformations (for example, warping or other types of stress) of the same package, which are due for example to processes of soldering to an external printed-circuit board (PCB) and to the corresponding thermal stresses.

Given that the mechanical properties of the detection structures directly affect the performance of MEMS devices, a desire to reduce as far as possible the effects of the aforesaid stresses is evident.

A solution that has been proposed for reducing the effects of stresses and the resulting deformations is illustrated in FIGS. 1a and 1b, with reference, by way of example, to a MEMS device 1 that implements a pressure sensor.

MEMS device 1 comprises a supporting base 2, for example of silicon, having a bottom surface in contact with the outside world.

MEMS device 1 further comprises a sensor die 4, in which a micromechanical detection structure 5 (represented schematically) is made, for example for detecting pressure. The sensor die 4 is mechanically coupled to a sensor frame 6, which, as shown in the schematic top plan view of FIG. 1b, externally surrounds the sensor die 4, via elastic coupling elements 8, in the form of folded springs (for example, S-shaped in plan view).

The elastic coupling elements 8, in a way not shown, also carry electrical-connection paths, for electrical connection between the mechanical detection structure 5 and the sensor frame 6, which may integrate appropriate electrical elements and components, possibly an ASIC (not illustrated) coupled to the mechanical detection structure 5. The sensor frame 6 further carries contact pads 7 for electrical connection with the outside world, for example by electrical wires.

Via this mechanical coupling, the sensor die 4 is arranged suspended over the supporting base 2. Stoppers 9 are coupled to a bottom portion of the sensor die 4, being arranged between the same sensor die 4 and the supporting base 2, in order to limit the displacements undergone by the sensor die 4 in a vertical direction, due to elastic deformation of the elastic coupling elements 8.

MEMS device 1 further comprises a cap 10, arranged above the sensor die 4, coupled to a top surface of the sensor frame 6. An air gap is present between the sensor die 4 and the cap 10 so that the micromechanical detection structure 5 is free to move in detecting a relevant quantity (for example, a pressure).

In this solution, the presence of the elastic coupling elements 8 advantageously enables an elastic coupling between the sensor die 4 (and the corresponding micromechanical detection structure 5) and the sensor frame 6, so as to reduce stresses (for example, of a thermomechanical type) acting on the sensor die 4. In fact, possible deformations undergone by the sensor frame 6, for example due to soldering of the supporting base 2 to an external PCB, are at least in part "absorbed" by the elastic coupling elements 8 so that stresses transmitted to the sensor die 4 are reduced.

BRIEF SUMMARY

The present Applicant has, however, realized that even this solution is not free from problems.

In particular, as illustrated in FIG. 2 (which refers to a modal analysis of the MEMS device 1), the present Applicant has realized that, due to external deformations, the sensor die 4 undergoes a stress that is not uniform throughout its extension, being for example greater at the portions of connection with the elastic coupling elements 8 (which, in this case, are arranged at the four corners of the sensor die 4, which has in plan view a substantially rectangular shape).

A non-negligible deformation of the sensor die therefore arises, and a consequent spurious variation, that may not be determined beforehand, of the response of the corresponding micromechanical structure 5 to the quantity that is to be detected.

One or more embodiments of the present disclosure may overcome, at least in part, the problem highlighted previously in order to reduce further the effects of stresses and deformations on the sensor die and on the corresponding micromechanical detection structure.

Accordingly, a MEMS device is provided. The MEMS device includes a supporting base having an inner surface and an outer surface. The MEMS device further includes a sensor die including semiconductor material and integrating a micromechanical detection structure. The MEMS device further includes a sensor frame arranged around the sensor die and coupled to a top surface of the supporting base. A cap is arranged above the sensor die and mechanically coupled to a top surface of the sensor frame. At least one conductive element electrically and mechanically couples the sensor die to the sensor frame. The sensor frame is supporting the sensor die only by the at least one conductive element. In another embodiment, a plurality of conductive elements is electrically and mechanically coupling the sensor die to the sensor frame.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein:

FIG. 1b is a schematic top plan view of the MEMS device of FIG. 1a;

FIG. 3b is a schematic top plan view of the MEMS device of FIG. 3a;

FIGS. 5 and 6 are cross-sectional views of variant embodiments of the MEMS device of FIG. 3a.

DETAILED DESCRIPTION

Figure 1A:
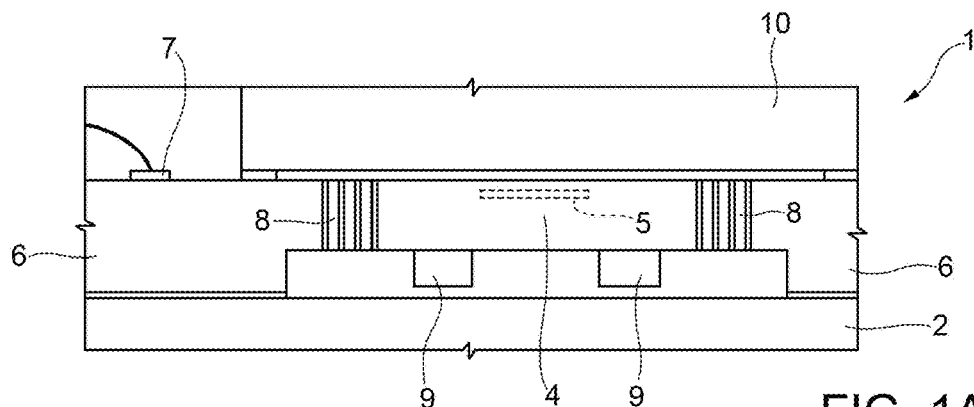
FIG. 1a is a cross-sectional view of a MEMS device of a known type.
Figure 1B:
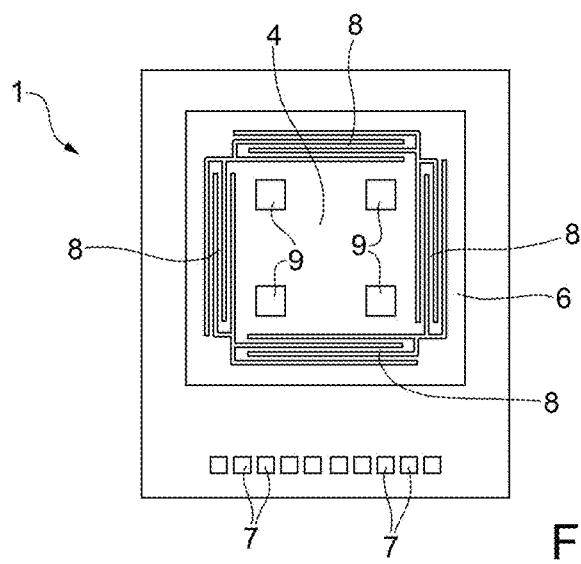
Figure 2:
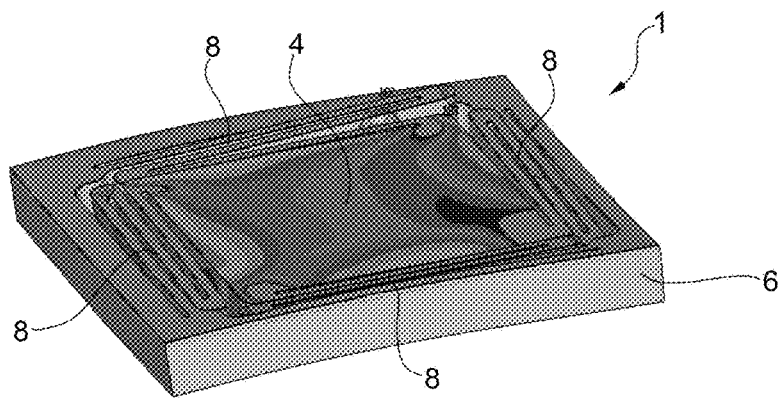
FIG. 2 is a simplified perspective view of the MEMS device of FIG. 1a, in the presence of stresses.
Figure 2:
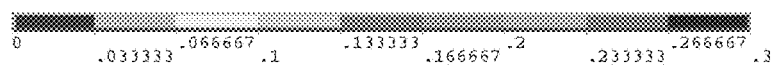
Figure 3A:
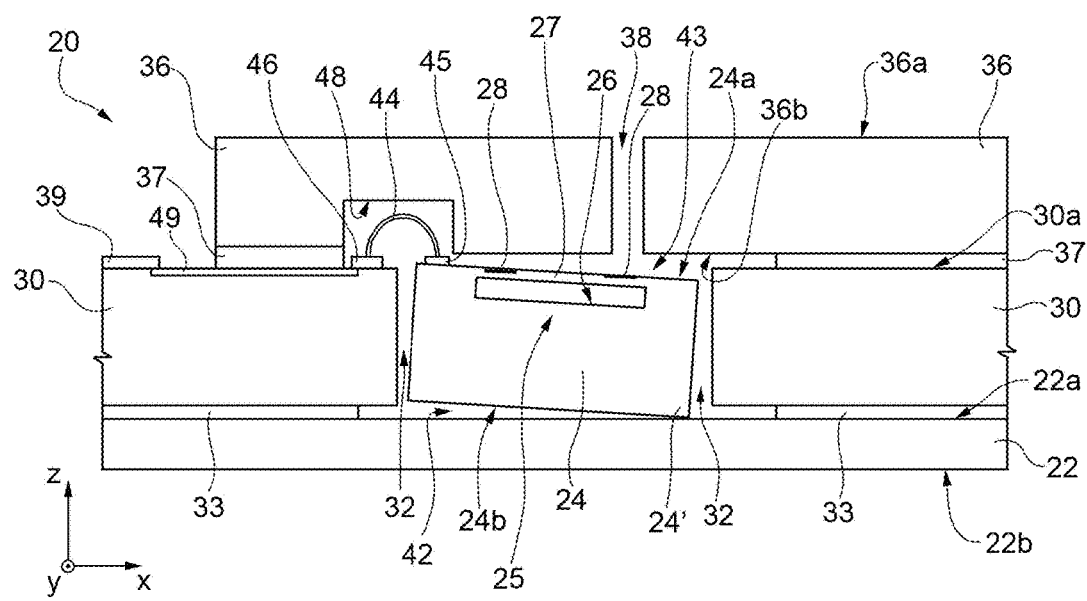
FIG. 3a is a cross-sectional view of a MEMS device according to an embodiment of the present solution.
Figure 3B:
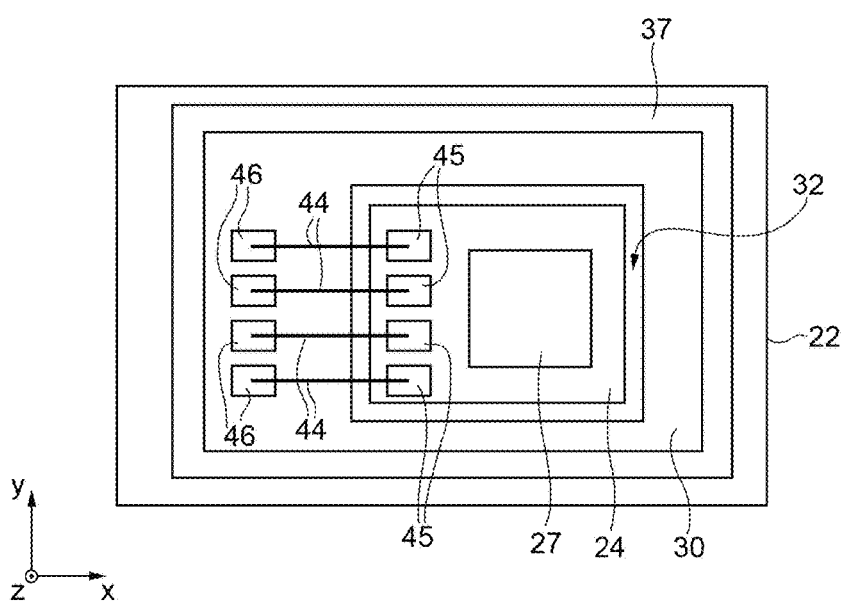

As shown in FIGS. 3a and 3b, a MEMS device according to one embodiment of the present solution, designated as a whole by 20, comprises a supporting base 22, for example of semiconductor material, in particular silicon, having a top surface 22a and a bottom surface 22b (which have a substantially planar extension in a horizontal plane xy, and are opposed with respect to one another in an orthogonal direction z). The bottom surface 22b of the supporting base 22 constitutes a bottom outer surface of the MEMS device 20, designed to be in contact with the external environment.

The MEMS device 20 further comprises a sensor die 24, in which a micromechanical detection structure 25 is made (for example, for detection of pressure), in the example comprising a cavity 26, buried within the sensor die 24, a membrane 27, arranged above the cavity 26, and piezoresistive elements 28, provided in the membrane 27.

The MEMS device 20 further comprises a sensor frame 30, which, as highlighted in the schematic top plan view of FIG. 3b, surrounds the sensor die 24 along its perimeter. In the example, the sensor die 24 has, in plan view, in the horizontal plane xy, a substantially rectangular shape, and the sensor frame 30 has the shape of a rectangular ring around the same sensor die 24.

In the embodiment illustrated, the sensor die 24 and the sensor frame 30 have a substantially same thickness in the orthogonal direction z (given that, as described in detail hereinafter, they are obtained from a same wafer of semiconductor material, such as silicon).

Furthermore, the sensor die 24 is separated laterally from the sensor frame 30 by a separation trench 32, having for example dimensions of less than 10 µm, in particular 2-3 µm, in the x and y directions of horizontal plane xy.

The sensor frame 30 is coupled to the supporting base 22 via a coupling region 33, for example of adhesive material, such as glass frit or other bonding material. In a possible embodiment, the coupling region 33 extends, for example with a rectangular-ring conformation, externally to the separation trench 32.

MEMS device 20 further comprises a cap 36, arranged above the sensor die 24, coupled to a top surface 30a of the sensor frame 30, by means of a further coupling region 37, for example of adhesive material, such as glass frit, or other bonding material.

Also the further coupling region 37 has, for example, the shape of a rectangular ring around the separation trench 32, as illustrated schematically in FIG. 3b.

A top surface 36a of the cap 36 constitutes a top outer surface of the MEMS device 20, designed to be in contact with the external environment.

An access duct 38 is possibly made through the cap 36, to enable fluid communication from outside towards the detection structure 25 in the sensor die 24, and to enable, for example, detection of the external environment pressure.

Furthermore, the top surface 30a of the sensor frame 30 carries, at an outer lateral portion not covered by the cap 36, electrical-connection elements 39 (for example, contact pads), for electrical connection, for example via electrical wires (not illustrated here), to external devices.

MEMS device 20 may further comprise a protection region (not illustrated herein), for example of epoxy resin, which laterally surrounds and protects the cap 36 and possibly the sensor frame 30 and the supporting base 22. This protection region does not cover, instead, the top surface 30a of the sensor frame 30 (so as to leave the access duct 38 free).

The supporting base 22 and the cap 36 form, in the embodiment described a package (at the wafer or substrate level) of the MEMS device 20.

According to a particular aspect of the present solution, the sensor die 24 is mechanically decoupled from the sensor frame 30, and is separated: from the sensor frame 30 by the separation trench 32; from the supporting base 22 by a bottom empty space 42; and from the cap 36 by a top empty space 43 (which also enables the membrane 27 of the detection structure 25 to undergo deformation in response to detection of the relevant quantity).

In other words, the sensor die 24 is arranged, in the package of the MEMS device 20, within a cavity, which is as a whole formed by the separation trench 32, by the bottom empty space 42, and by the top empty space 43.

In particular, in the embodiment illustrated, the sensor die 24 may rest in contact with the top surface 22a of the supporting base 22, at a bottom surface 24b thereof and at a bottom lateral edge portion thereof, designated by 24', whereas for the remaining part it is suspended over the same supporting base 22.

During operation, advantageously, movements of the sensor die 24 are thus physically confined and limited laterally in the separation trench 32 (which has an extension in the horizontal plane xy of a few microns), and at the bottom and at the top in the bottom and top empty spaces 42 and 43 (which also have an extension along the vertical direction z of a few microns).

The electrical interfacing between the micromechanical detection structure 25 in the sensor die 24 and the sensor frame 30 (and possible electrical components integrated in the same sensor frame 30, which possibly form an ASIC operatively coupled to the micromechanical detection structure 25) is implemented via one or more electrical-connection wires 44 using the wire-bonding technique.

In particular, the electrical-connection wire(s) 44 connect at least one first contact pad 45, carried by a top surface 24a of the sensor die 24 (facing the cap 36), to at least one second contact pad 46, carried by the top surface 30a of the sensor frame 30, arranged internally with respect to the coupling region 37 and underneath the cap 36.

The cap 36 consequently has, at a bottom surface thereof 36b facing the sensor die 24, a housing cavity 48, which is designed to house the electrical-connection wires 44.

Furthermore, electrical-connection paths 49, made in a surface portion of the sensor frame 30, connect the second contact pads 46 to the electrical-connection elements 39, to enable electrical connection towards the outside of the MEMS device 20 (or possibly to the aforesaid electrical components integrated in the sensor frame 30).

As illustrated in FIG. 3b, in a possible embodiment, the first contact pads 45 are aligned in the horizontal plane xy, along a side of the sensor die 24, for example in the y direction. The second contact pads 46 are aligned in the same y direction, parallel to the first contact pads 45, along a side of the sensor frame 30 facing the sensor die. The electrical-connection wires 44 connect together the first and second contact pads 45, 46 crossing the separation trench 32.

Advantageously, in the embodiment illustrated, being mechanically decoupled from the sensor frame 30 other than by the electrical-connection wires 44, the sensor die 24 is not affected by the stresses possibly acting from outside on the same sensor frame 30 (for example, as a result of thermo-mechanical deformations). Consequently, in this case no undesirable variations arise in the response of the micromechanical detection structure 25 upon detection of the relevant quantity (in the example, a pressure).

Figure 4A:
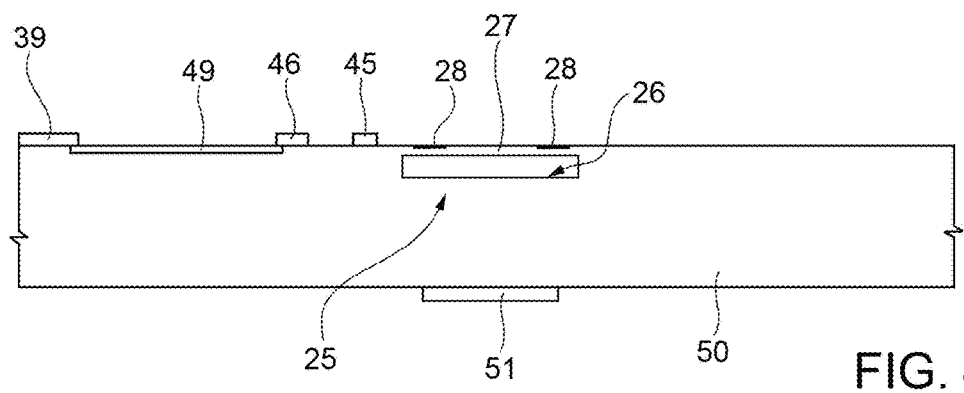
FIGS. 4a-4f are cross-sectional views of the MEMS device of FIG. 3a, in successive steps of a corresponding manufacturing process.

With reference first to FIG. 4a, an embodiment of a manufacturing process of the MEMS sensor device 20 is now described.

In a way that will be evident to a person of ordinary skilled in the field, a plurality of MEMS devices 20 are made starting from a same wafer being processed. In FIG. 4a and in the subsequent figures, formation of just one of these MEMS devices 20 is represented for reasons of clarity of illustration.

In particular, the aforesaid FIG. 4a regards an intermediate step of the manufacturing process, where, with known techniques, the micromechanical detection structure 25 has already been obtained within a sensor wafer 50, of semiconductor material, for example silicon (as described hereinafter, starting from a same sensor wafer 50, the sensor die 24 and the sensor frame 30 will be obtained). In particular, the cavity 26, the membrane 27 arranged over the cavity 26, and the piezoresistive elements 28 within the membrane 27 have thus been obtained.

In the same sensor wafer 50 (once again with known techniques) the electrical-connection elements 39, the first and second contact pads 45, 46, and the electrical-connection paths 49 have further been previously obtained.

In this step of the manufacturing process, underneath the portion of the sensor wafer 50 in which the sensor die 24 will be obtained, a sacrificial region 51 is further formed, constituted, for example, by a film of polymeric material that may be removed by chemical etching (usually known as "photoresist").

For instance, this sacrificial region 51 may have a full rectangular conformation in the horizontal plane xy, with an extension smaller than that of the sensor die 24. As will be highlighted hereinafter, the role of this sacrificial region 51 is to physically support the sensor die 24 (once formed) during one or more steps of the manufacturing process.

Figure 4B:
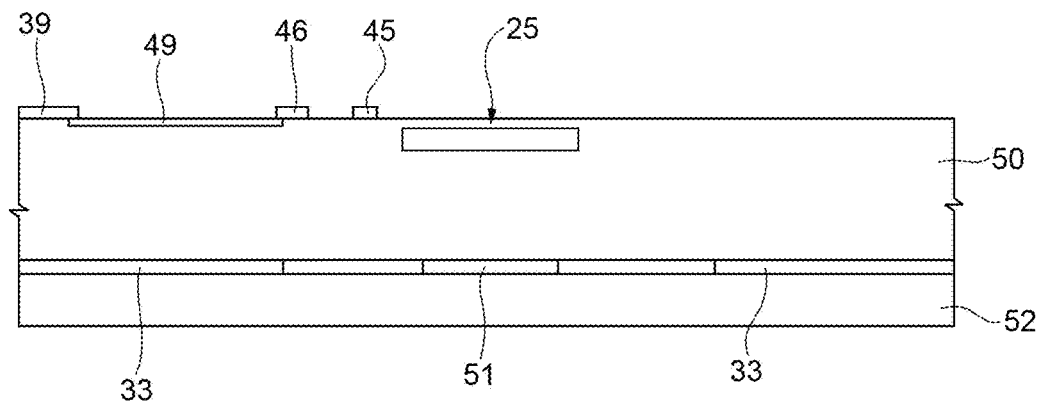

Referring to FIG. 4b, the sensor wafer 50 is coupled to a supporting wafer 52 (as described hereinafter, starting from the supporting wafer 52 the supporting base 22 will be obtained) via the coupling region 33, which is, for example, of adhesive material, such as glass frit or other bonding material. In a possible embodiment, the coupling region 33 extends, for example with a rectangular-ring conformation, externally to the portion of the sensor wafer 50 in which the sensor die 24 will be obtained.

In this step, the sacrificial region 51 is arranged between the sensor wafer 50 and the supporting wafer 52, in the region where the sensor die 24 will be obtained.

Figure 4C:
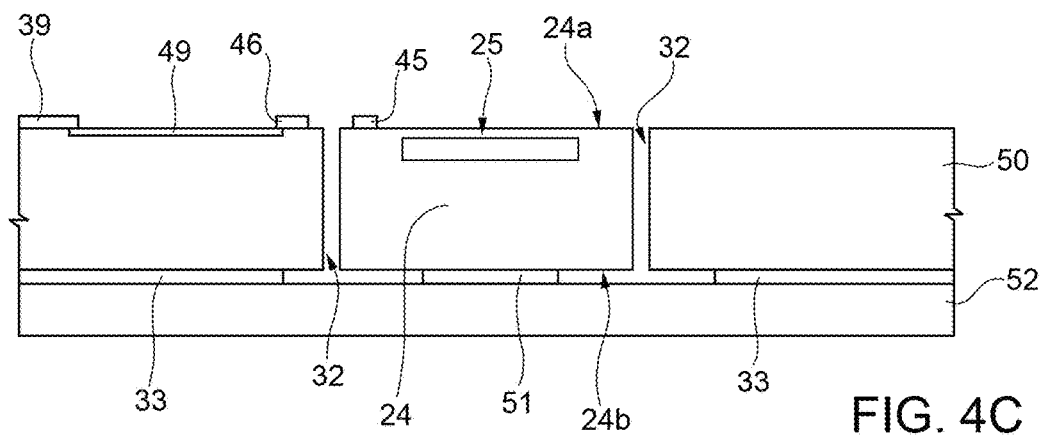

Referring to FIG. 4c, the separation trench 32 is obtained, for example via chemical etching; at the same time, the sensor die 24 is defined with respect to the sensor wafer 50. The sensor die 24 remains, in this step, fixed to the underlying sacrificial region 51, by which it is further supported, with the corresponding top surface 24a and bottom surface 24b substantially horizontal (parallel to the horizontal plane xy).

Figure 4D:
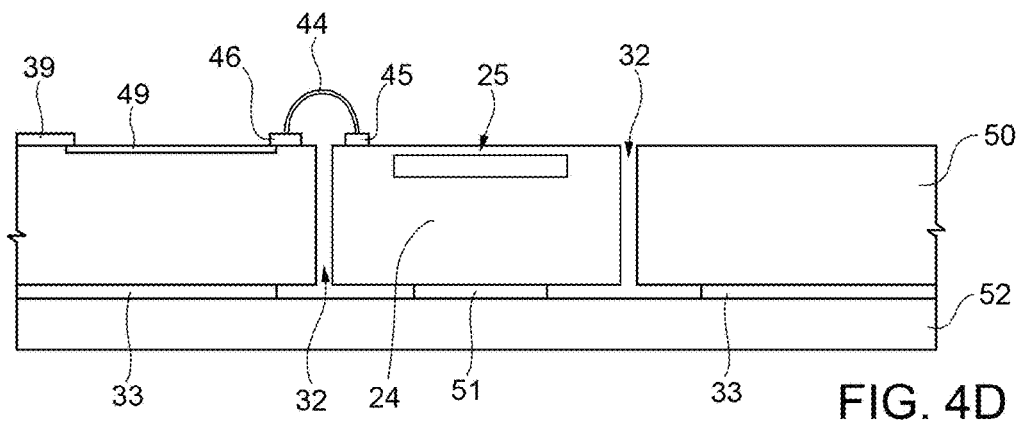

Referring to FIG. 4d, the electrical connections are made between the first and second contact pads 45, 46, via the electrical-connection wires 44, using the wire-bonding technique.

In particular, in a known manner (not described in detail herein), a soldering head of a soldering machine is applied on the sensor die 24 to provide, by application of a localized contact force, heat and/or ultrasound energy, coupling between the electrical-connection wires 44 and the first contact pads 45. In this step, the presence of the sacrificial region 51 enables proper execution of this coupling, keeping the sensor die 24 in a stable and substantially horizontal position.

Figure 4E:
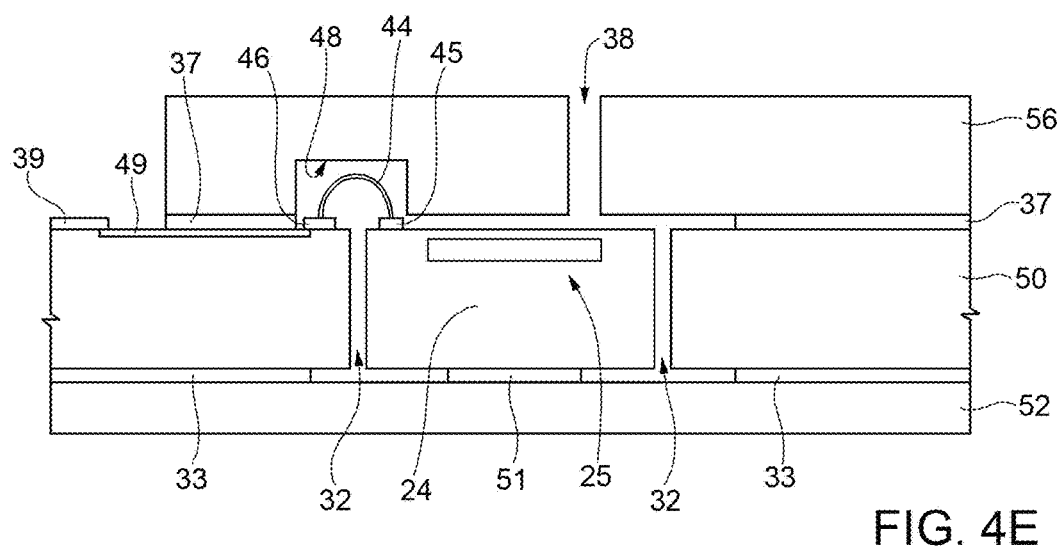

Referring to FIG. 4e, coupling is obtained between the sensor wafer 50 (and the associated supporting wafer 52) and a cap wafer 56 (as described hereinafter, starting from this cap wafer 56 the cap 36 will be obtained).

In particular, the cap wafer 56 is coupled above the sensor wafer 50 by the further coupling region 37. In the cap wafer 56, the access duct 38 and the housing cavity 48 have already been formed (with known techniques).

Figure 4F:
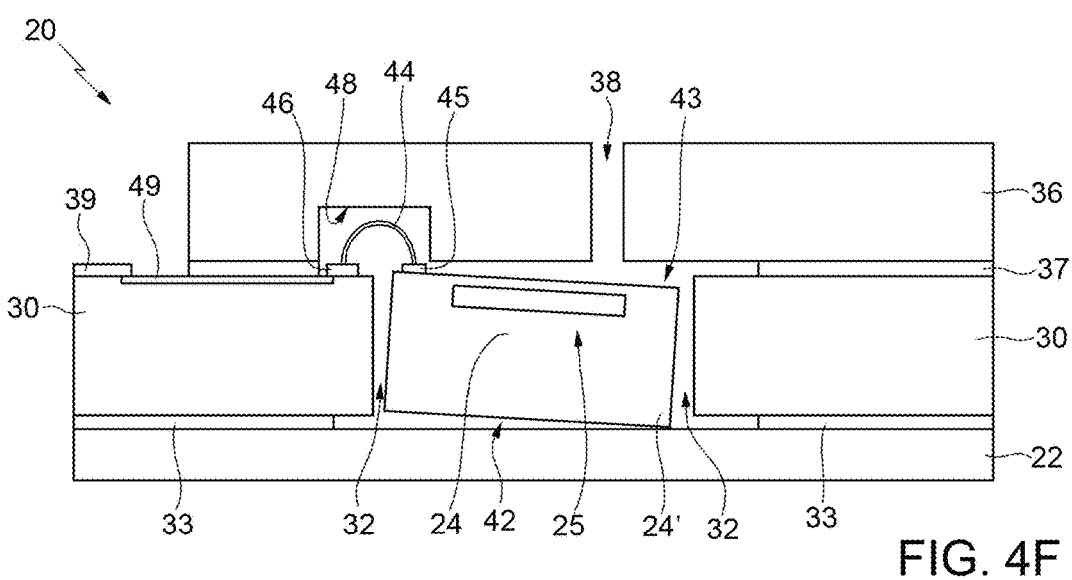

Referring to FIG. 4f, the sacrificial region 51 is removed, for example by wet chemical etching so that the sensor die 24 remains suspended within the cavity, which is as a whole formed by the separation trench 32, by the bottom empty space 42 (created following upon removal of the same sacrificial region 51), and by the top empty space 43. As mentioned above, the sensor die 24 is mechanically coupled to the sensor frame 30 only by way of the electrical-connection wires 44. The sensor die 24 possibly rests on the underlying supporting wafer 52, at the bottom lateral edge portion 24' thereof.

As illustrated once again in FIG. 4f, after the possible formation of the protection region (here not illustrated) an operation of sawing of the sensor wafer 50, of the supporting wafer 52, and of the cap wafer 56 is then carried out for definition of the supporting base 22, of the sensor frame 30, and of the cap 36 of MEMS device 20.

The same MEMS device 20, which at this point is completely formed, may subsequently be electrically coupled to external devices via the electrical-connection elements 39 and corresponding electrical wires.

The advantages of the present solution are clear from the foregoing description.

In any case, it is emphasized once again that this solution enables mechanical decoupling of the sensor die 24 in which the micromechanical detection structure 25 is provided, which is in fact arranged within a cavity, separated from the sensor frame 30 and from the cap 36, thus being substantially immune from any external mechanical stress.

The sensor die 24 is coupled (for electrical connection) to the sensor frame 30 only through the electrical-connection wires 44, which evidently have an effect of mechanical coupling that is altogether negligible (having a small width and low stiffness). In particular, the stiffness of the electrical-connection wires 44 may be reduced by increasing the length of the corresponding loop, in these conditions acting as a spring with negligible stiffness.

The same electrical-connection wires 44 thus "absorb" any stresses caused by possible deformations of the sensor frame 30, without the same deformations affecting the sensor die 24.

Finally, it is clear that modifications and variations may be made to what has been described and illustrated herein, without thereby departing from the scope of the present disclosure.

In particular, it is emphasized that the solution described may be advantageously applied also to other types of MEMS devices, where the micromechanical detection structure is configured to detect different quantities, for example a force, acoustic waves, environmental quantities, etc.

In addition, as an alternative to what has been illustrated previously, and as illustrated in FIG. 5, the sacrificial region 51 may comprise a number of distinct portions 51', for example two or four (in this case, arranged at the corners of the sensor die 24), in any case arranged so to support the same sensor die 24 during the wire-bonding step.

Figure 6:
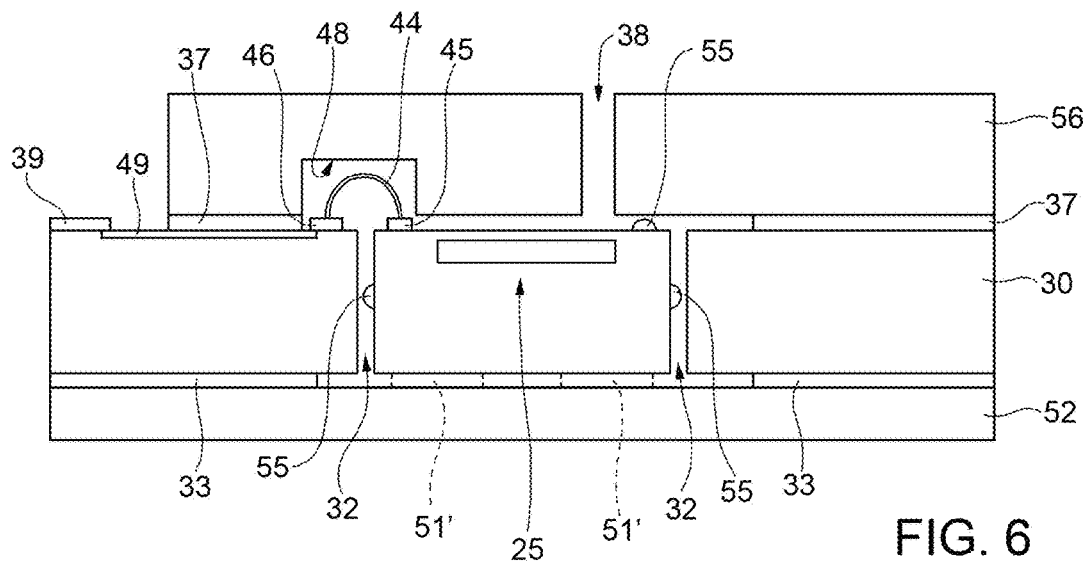

Furthermore, as illustrated in FIG. 6, stoppers 55 may be provided (with any known technique), coupled to the sensor die 24, laterally and/or at the top, so to reduce further the possibility of movement in a lateral direction (parallel to the horizontal plane xy) and/or a vertical direction (in the orthogonal direction z).

It should be noted that represented dashed in FIG. 6 are the aforesaid distinct portions 51' of the sacrificial region 51, which have been removed in this step of the manufacturing process.

In a way not illustrated, appropriate electrical-connection elements may further be provided, for example in the form of electrical-connection lands or conductive bumps, carried by the bottom surface 22b of the supporting base 22, for electrical connection with the outside world. In this case, conductive through holes may be provided traversing in an orthogonal direction the thickness of the sensor frame 30 and of the supporting base 22, in order to provide an electrical connection with the electrical-connection elements 39 or the electrical-connection paths 49, for electrical connection with the outside of the MEMS device 20.

Figure 5:
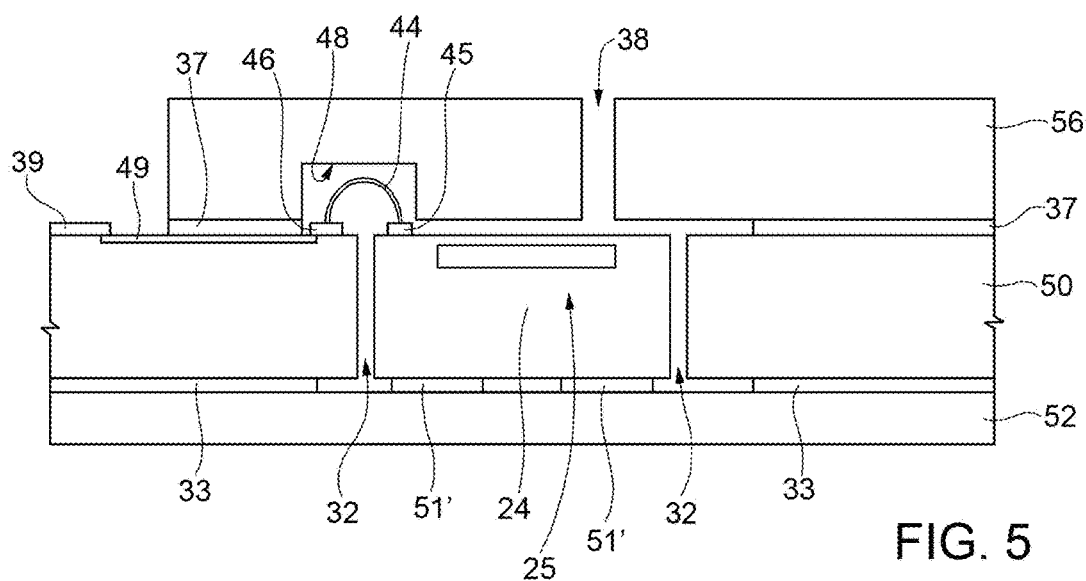
Figure 7:
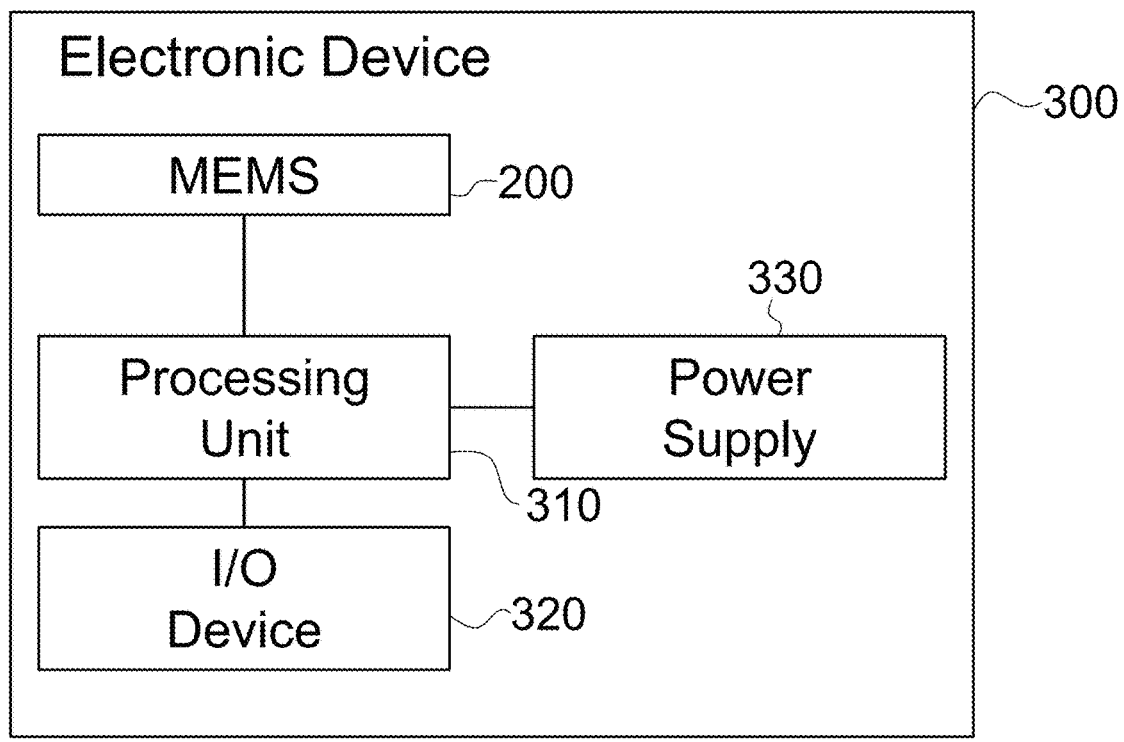
FIG. 7 is a block diagram of an electronic device including a MEMS device.

FIG. 7 illustrates a block diagram of an electronic device that includes a MEMS device, such as the MEMS devices of FIGS. 3a, 5, and 6. The electronic device may be a mobile communications apparatus, such as a mobile phone and a personal digital assistant, a laptop, a desktop computer, a camera or video device including a network video, a vehicle parking sensor, a wearable device, such as a smartwatch, or any other electronic device. The electronic device 300 includes a processing unit 310 and a MEMS device 200 that is electrically coupled to the processing unit. The processing unit 310 includes control circuitry, which may include one or more processors, memory, and discrete logic. The processing unit 310 is configured to transmit signal to and receive signals from the MEMS device 200. The electronic device may further include an input/output device 320, for example, a keyboard or a display that is coupled to the processing unit. The electronic device may further include a power supply 330, which may be a battery or components for coupling to an external power source.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process for manufacturing a MEMS device, the process comprising:
   coupling a sensor wafer to a supporting wafer, the sensor wafer including semiconductor material and including a sensor die integrating a micromechanical detection structure and a sensor frame;
   separating the sensor die from the sensor frame, the sensor frame being arranged around the sensor die;
   after separating the sensor die from the sensor frame, electrically and mechanically coupling at least one conductive element to the sensor die and the sensor frame, wherein the sensor frame supports the sensor die only by the at least one conductive element;
   coupling a cap wafer to a surface of the sensor frame; and
   mechanically decoupling the sensor die from the supporting wafer.

2. The process according to claim 1, wherein:
   coupling the sensor wafer to the supporting wafer comprises arranging a sacrificial region between the sensor wafer and the supporting wafer, wherein the sacrificial region is under the sensor die; and
   mechanically decoupling comprises removing the sacrificial region.

3. The process according to claim 2, further comprising:
   forming, on a surface of the sensor wafer, at least one first electrical-contact pad, and at least one second electrical-contact pad; and
   electrically coupling the first electrical-contact pad and the second electrical-contact pad by the at least one conductive element, the at least one conductive element having a negligible stiffness and consequently a negligible mechanical coupling effect.

4. The process according to claim 3, wherein the at least one conductive element is a plurality of conductive elements, and wherein electrically and mechanically coupling the plurality of conductive elements to the sensor die and the sensor frame is carried out prior to mechanically decoupling the sensor die from the supporting wafer.

5. The process according to claim 4, wherein arranging the sacrificial region between the sensor wafer and the supporting wafer comprises forming the sacrificial region so as to support the sensor die during the electrical and mechanical coupling.

6. The process according to claim 4 wherein, after removing the sacrificial region, an edge of the sensor die rests on the supporting wafer.

7. The process according to claim 2 wherein:
   separating the sensor die comprises forming a separation trench throughout a thickness of the sensor wafer; and
   upon removing the sacrificial region, the sensor die is separated laterally, throughout its thickness, from the sensor frame via the separation trench, and is further separated from the supporting wafer by a first empty space and from the cap wafer by a second empty space, the sensor die being arranged within a cavity jointly formed by the separation trench and by the first and second empty spaces.

8. A process comprising:
coupling a first wafer of semiconductor material to a supporting wafer;
forming a plurality of sensor dice in the first wafer, each of the plurality of sensor dice integrating a microelectromechanical detection structure;
using conductive wires, mechanically and electrically coupling the plurality of sensor dice to a plurality of sensor frames, respectively, the plurality of sensor frames surrounding and separated from the plurality of sensor dice, respectively; and
after mechanically and electrically coupling the plurality of sensor dice to the plurality of sensor frames, removing a layer of material between the plurality of sensor dice and the supporting wafer.

9. The process of claim 8, wherein removing the layer of material between the plurality of sensor dice and the supporting wafer causes an edge of each of the plurality of sensor dice to rest against the supporting wafer.

10. The process of claim 9, wherein the plurality of sensor dice are tilted relative to a surface of supporting substrate.

11. The process of claim 8, wherein mechanically and electrically coupling the plurality of sensor dice to the plurality of sensor frames, respectively, comprises coupling first ends of conductive wires to the plurality of sensor dice, respectively and second ends of the conductive wires to the plurality of sensor frames, respectively.

12. The process of claim 11, wherein for each sensor die, the first ends of the conductive wires are coupled at one side of the sensor die.

13. The process of claim 8, further comprising coupling a cap wafer to the plurality of sensor frames, and singulating the plurality of sensor dice and plurality of sensor frames to form individual packages.

14. A process for manufacturing a MEMS device, the process comprising:
coupling a sensor wafer of semiconductor material to a supporting wafer using a coupling material;
forming at least one sensor die integrating a micromechanical detection structure in the sensor wafer;
separating the at least one sensor die from a sensor frame, the sensor frame being part of the sensor wafer, the sensor frame being arranged around the at least one sensor die, the sensor frame and the at least one sensor die being mechanically coupled to the supporting wafer by the coupling material;
after separating the at least one sensor die from the sensor frame, electrically and mechanically coupling a conductive element of the sensor frame to a bond pad of the at least one sensor die; and
after electrically and mechanically coupling the conductive element of the sensor frame to the bond pad, removing the coupling material between the at least one sensor die and the supporting wafer.

15. The process of claim 14, further comprising coupling a cap wafer to a surface of the sensor frame, the cap wafer covering at least a portion of the at least one sensor die.

16. The process of claim 14 wherein electrically and mechanically coupling the conductive element of the sensor frame to the bond pad of the at least one sensor die comprises coupling a first end of a conductive wire to the conductive element and a second end of the conductive wire to the bond pad.

17. The process of claim 16 wherein electrically and mechanically coupling the conductive element of the sensor frame to the bond pad of the at least one sensor die comprises coupling a plurality of conductive wires between conductive elements of the sensor frame and bond pads of the at least one sensor die.

18. The process of claim 17 wherein the bond pads of the at least one sensor die are along a first edge of the at least one sensor die.

19. The process of claim 18 wherein the first edge of the at least one sensor die is opposite a second, lower edge of the at least one sensor die that rests on the supporting wafer.

20. A process for manufacturing a MEMS device, the process comprising:
coupling a sensor wafer of semiconductor material to a supporting wafer using a coupling material;
forming at least one sensor die integrating a micromechanical detection structure in the sensor wafer;
separating the at least one sensor die from a sensor frame, the sensor frame being part of the sensor wafer, the sensor frame being arranged around the at least one sensor die, the sensor frame and the at least one sensor die being mechanically coupled to the supporting wafer by the coupling material;
electrically and mechanically coupling a conductive element of the sensor frame to a bond pad of the at least one sensor die; and
removing the coupling material between the at least one sensor die and the supporting wafer, wherein removing the coupling material between the at least one sensor die and the supporting wafer causes a side of the at least one sensor die to tilt toward the supporting wafer.

21. The process of claim 20 wherein electrically and mechanically coupling the conductive element of the sensor frame to the bond pad of the at least one sensor die comprises coupling a first end of a conductive wire to the conductive element and a second end of the conductive wire to the bond pad.

22. The process of claim 20, further comprising coupling a cap wafer to a surface of the sensor frame, the cap wafer covering at least a portion of the at least one sensor die.

* * * * *